(12) United States Patent  (10) Patent No.: US 6,353,400 B1
Moore  (45) Date of Patent: Mar. 5, 2002

(54) RADICALLY ABBREVIATED DECODING

(75) Inventor: George Stennis Moore, Veradale, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/447,537

(22) Filed: Nov. 23, 1999

(51) Int. Cl.[7] .................. H03M 13/00; H03M 13/03
(52) U.S. Cl. .................. 341/94; 714/746; 714/790
(58) Field of Search ............... 375/262, 130, 375/255, 254; 714/790, 746, 786; 341/94, 87, 51

(56) References Cited

U.S. PATENT DOCUMENTS 5,029,331 A * 7/1991 Heichler et al. ............ 714/790
5,668,820 A * 9/1997 Ramesh et al. ............. 714/786
5,878,085 A * 3/1999 McCallister et al. ........ 375/280
6,166,667 A * 12/2000 Park ............................ 341/94

* cited by examiner

Primary Examiner—Patrick Wamsley

(57) ABSTRACT

A method and apparatus for radically abbreviated decoding for providing decoded data by dividing a stream of data symbols, which form the decoder input, into symbol bit streams. The symbol bit streams are combined with delayed data streams in a first formatting means forming formatted bit streams. The formatted bit streams are applied to a selecting means for selecting bits from the formatted bit streams, forming a selected formatted bit stream. The selected formatted bit stream is applied to a sequential storage means forming delayed bits. The delayed bits are tapped from different points on the sequential storage means forming weighted bits. The weighted bits are then combined with a second formatting means further forming the delayed data streams, where the selected formatted bit stream is the decoded data.

17 Claims, 1 Drawing Sheet

RADICALLY ABBREVIATED DECODING

CROSS REFERENCE TO RELATED APPLICATIONS

BACKGROUND OF THE INVENTION

1. Field of the Invention.

This invention relates to communications equipment, and more particularly to encoding and decoding data transmissions from and to such equipment, and still more particularly to testing such equipment transmissions including such encoding and decoding.

2. Prior Art

There is a continuing need for simple, low cost apparatus for testing cellular mobile phones or base stations, where the testing equipment is connected in such a way that very high signal-to-noise ratios exist, no multipaths exist, and little interference is present. To enable this testing often requires decoding convolutionally encoded data streams with methods that accommodate minimum complexity, but which still accommodate puncturing and blind rate determination. Present methods have complexities that are orders of magnitude greater than the encoder complexity. Under these testing conditions, the convolutionally coded data bits that are sent may be detected very reliably and allow negligible detection errors, but the decoding equipment is complex and expensive.

It is well known that most unpunctured convolutional codes can be instantaneously decoded with simple circuitry. (See for example, Linear Sequential Machines, Chapter 15, Switching and Finite Automata Theory, Zvi Kohavi, McGraw-Hill, 1970.) However, to control the data rate, the codes may be punctured. Puncturing removes selected coded data bits to increase the effective code rate of the code, and the prior art simple methods of decoding are no longer useful in codes with puncturing.

A second problem is that some systems send different amounts of data in successive frames. For example, some will send data at full rate, half rate, quarter rate, and eighth rate. This data rate is not to be confused with the code rate effected by the encoder and puncturing. The receiver does not know the amount of data sent in a particular data frame. It is expected to decode for all the possible data rates and, from decoder metrics for each decode attempt, determine the rate that was most likely sent. The decoded data from this decode is then presented as the transmitted data. This technique is referred to as blind-rate determination.

The present art is well established in this area. For full decoding in the presence of noise and interference, Viterbi maximum-likelihood algorithms are almost universally employed.

Recognizing the need for limited correction capability, abbreviated algorithms have been developed. The number of gates that implemented this was about 25,000 plus some memory to hold the trellis states.

For some applications this number of gates is still prohibitively expensive. A new and improved solution for the problem has long been needed in, for example, testing, and this need has become more urgent with time.

SUMMARY OF THE INVENTION

It is an object of the present invention to provide a Radically Abbreviated Decoding (RAD) method and apparatus that can operate in the presence of puncturing and can support blind-rate determination for a fast convolutional decoder. The examples given assume two arms for the code, but it will be obvious to those with ordinary skills in the art to extend the invention to include more aims. In addition, while the examples relate to rate 1/N codes, this method may be extended to rational encoders, rate M/N, with the use of linear algebra to solve for the M incoming bits.

Faced with the need for a lower cost, simpler way of decoding symbols, it has been determined that reversing the encoding method as disclosed, together with means for handling punctured codes, can be used where accurate data decisions are available.

This method and apparatus is limited in that it has no tolerance for decision errors in the decoded data, only to erasures (punctured bits). A single bit error would propagate causing errors to occur throughout the remainder of the frame due to the recursive nature of the decoder. For this reason it is not applicable where very reliable symbol decisions are not available, and is intended primarily for situations with reliable symbol decisions such as testing. It will be clear to those skilled in the art that such capability could be added, if needed; with some incremental change in complexity and cost. The preferred embodiment is for testing, where such capability is not needed, the effort to develop such capability was not required and not expended.

The present invention may be simply extended to additional arms, for example, rate ⅓ codes or to non-instantaneously decodable codes. Other objects, features and advantages of the present invention and equivalents to the invention will be apparent to those with ordinary skill in the art, and form a part of this invention. For example, many of the elements of this invention, such as shifting data, while described in terms of hardware, might be implemented in software.

BRIEF DESCRIPTION OF THE DRAWINGS

The accompanying drawings where like numerals indicate like components and which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
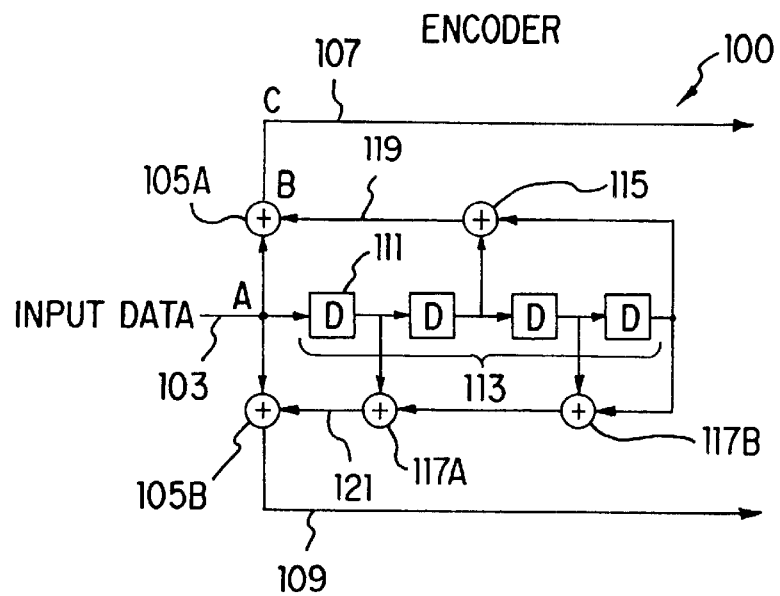
FIG. 1 is a schematic showing an encoder of the prior art.

FIG. 1 shows an embodiment of a representative rate ½ convolutional encoder 100 with input data 103 combining with weighted data 119 and 121 and forming two bit stream arms 107 and 109; though it will be appreciated that the invention anticipates an arbitrary number of aims. The encoder 100 is drawn to facilitate the description of the RAD decoder. The outputs of the two arms is generated by the exclusive-or 105A and 105B of the new input data 103 and delayed data 119 and 121, also referred to as weighted data since it represents combinations of different delays or weights of the delayed data 111. The delayed data 111, here being formed by a shift register 113, in the form of bit streams, combines in exclusive-or 115 forming data 119 and 117A–B forming data 121. The available output bits from the arms, in combination, are referred to as a coded symbol, here a bit from the bit stream arm 107 and a bit from the bit stream arm 109, if they exist; in other words, if they are not punctured. The invention assumes they are not both punctured in a single coded symbol.

Figure 2:
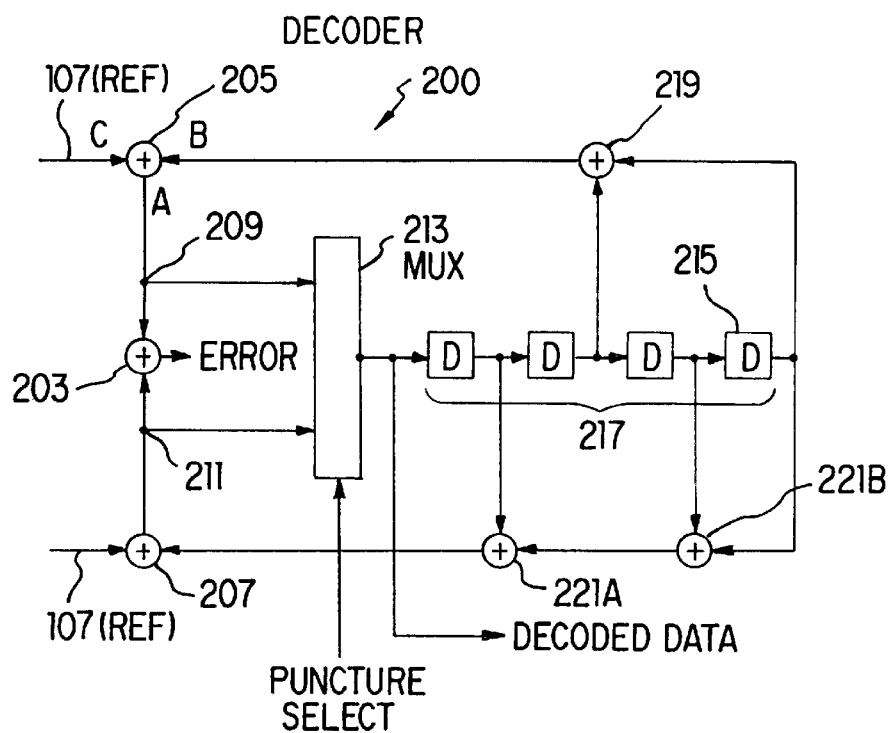
FIG. 2 is a decoder of the invention.

FIG. 2 is the corresponding Radically Abbreviated Decoder (RAD) 200. The structure to the right of the multiplexer 213 is substantially identical to that of the encoder 100, with delay stages 215 corresponding to delay stages 111, shift register 217 corresponding to shift register 113, and the exclusive-or gates 219 corresponding to exclusive-or gate 115. Exclusive-or gates 205 generate the outputs 209 of the decoder from a combination of the symbols from the encoder and the outputs from exclusive-or 219. In the absence of punctured bits outputs 209 will be the same as the input data 103 of the encoder; with the multiplexer 213 selecting bits that have not been punctured from the outputs 209. The operation of the decoder is based on the following relation manifested by the exclusive-or function:

If C=A+B; representing the encoder, where+represents the exclusive-or operator, then it follows from modulo-2 arithmetic that A=B+C represents the disclosed decoder with noted extensions, such as the multiplexer and its control signals for handling punctured data.

The decoder is limited in that it has no tolerance for decision errors in the decoded data, only to erasures (punctured bits). A single bit error would propagate causing errors to occur throughout the remainder of the frame due to the recursive nature of the decoder. For this reason it is not applicable where reliable symbol decisions are not available, and is intended primarily for situations with reliable symbol decisions such as testing.

The encoding and decoding may be simply extended to additional arms; for example, for quarter, eighth, or other data rates, or to non-instantaneously decodable codes. Instantaneous decoding is more commonly used.

FIG. 2 illustrates an embodiment of the decoder 200. Initially assume the data in the decoder shift register 217 is the same as in the shift register 113 in encoder 100. Then the feedback sum in the decoder from exclusive-or 219 is the same as that in the encoder at 119, with 209, 211 the same as 103. From the above relation, it is seen that in the absence of puncturing, the output of the exclusive-or gate 209 or 211 feeding the multiplexer 213 must be equal to A 103, the input to the encoder. If the multiplexer 213 is selected to pass this data to a shift register data bit 215, the equivalent input data to that of the input A 103 to the shift register 113 is presented to the decoder shift register 217. When both circuits are clocked, the resulting data in both shift registers is again the same. As long as there are no punctured bits, this decoder will decode the encoded stream yielding the input data to the encoder. In the framed data applications for which this method is intended, the initial condition of the shift register 113 and of the shift register 215 is known, allowing the method to be started.

The lower arm data from the output of the exclusive-or 221A and 221B is not required to decode the data. It is redundant. However, the decoder could employ only the data from the lower arm and decode as well. Puncturing results in a data bit from one of the arms not being sent. If the data from the upper arm were punctured, the decoder could not determine the input data from the encoder and the decoder would fail. However, if the multiplexer were selected to the lower arm for this condition, the decoding would continue properly. In practice good coding design dictates that both arms not be punctured simultaneously, so proper decoding occurs so long as the multiplexer selects the non-punctured arm.

Most of the time neither arm is punctured and the multiplexer can be selected arbitrarily. In this case, both the upper and lower decoder arms should be predicting the same data. If they are different, a decoding error has occurred. This condition may be latched over the decoding of a frame to identify a frame decoding failure and thereby used to effect blind-rate determination. If the detected symbols associated with different data rates are applied to corresponding decoders, decoding failures will be detected in all the mismatched decoders with a high degree of reliability. The decoder corresponding to the correct rate should not incur any errors. The probability of falsely identifying a frame as correctly decoded is approximately one half to the Nth power, where N is the number of coded symbols not containing punctured bits in the frame. With only 20 symbols not containing punctured bits, the probability of falsely indicating a frame is correct is less than I in a million. In the applications of interest, there are many more symbols not containing punctured bits than this in even the lowest data rate frame. This will result in very reliable blind-rate determinations.

For the example shown, the complexity of the decoder 200 is about 450 gates, a 50-fold reduction in gates below the decoding method having substantially 25,000 gates previously discussed. The only memory required is that of the shift register 215. From the example, it is clearly seen that the complexity of this decoder is of the same order as that of the encoder; indicating that the complexity may be at an irreducible minimum.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An apparatus for radically abbreviated decoding providing decoded data comprising:

means for dividing a stream of input data symbols for decoding into bit streams;

means for combining the bit streams with combinations of delayed data in the form of weighted data in a first formatting means forming formatted bit streams;

means for applying the formatted bit streams to a selecting means for selecting bits from the formatted bit streams, forming a selected formatted bit stream;

means for applying the selected formatted bit stream to a sequential storage means for further forming the combinations of delayed data;

means for tapping the combinations of delayed data from different points on the sequential storage means forming tapped data;

means for combining the tapped data with a second formatting means for forming the weighted data; with the selected formatted bit stream further being the decoded data.

2. The apparatus of claim 1 wherein the bits from the formatted bit streams forming the selected formatted bit stream are selected from bits that have not been punctured.

3. The apparatus of claim 2 wherein the decoded data can be selected from bits that have not been punctured from any bit stream of the formatted bit streams.

4. The apparatus of claim 3 wherein the selecting of said bits that have not been punctured is by means of a multiplexer having a puncture select signal controlling said multiplexer.

5. The apparatus of claim 1 wherein the elements of the invention are realized in software.

6. The apparatus of claim 1 wherein the formatting means are exclusive-ors.

7. The apparatus of claim 1 wherein the sequential storage means is a shift register.

8. The apparatus of claim 1 wherein the selecting means is a multiplexer.

9. The apparatus of claim 1 further comprising a code rate being the reciprocal of the number of bits in a data symbol.

10. The apparatus of claim 1 wherein said input data symbols are from rational codes; and wherein the bits streams are derived from said input data symbols by employing linear algebra.

11. A method for radically abbreviated decoding providing decoded data comprising:

dividing data symbols, said data symbols forming an input, into bit streams;

combining the bit streams with combinations of delayed data, said combinations of delayed data further comprising weighted data, forming formatted bit streams;

selecting bits from the formatted bit streams, forming a selected formatted bit stream;

storing delayed data from the selected formatted bit stream in a sequential storage means;

tapping the combinations of delayed data from different points on the sequential storage means forming tapped data;

combining the tapped data in a second formatting means forming the weighted data;

with the selected formatted bit stream further being the decoded data.

12. The method of claim 11 wherein storing delayed data from the selected formatted bit stream in a sequential storage means further comprises the step of shifting the delayed data to a next location when new data is stored.

13. The method of claim 11 wherein forming the tapped data is by the step of performing the exclusive-or function on the bits being tapped.

14. The method of claim 11 wherein the step of combining tapped data forming weighted data is by the step of performing the exclusive-or function on the tapped data.

15. The method of claim 11 wherein the step of combining the bit streams with the weighted data for forming formatted bit streams is by the step of performing the exclusive-or function on bits of the weighted data and bits of the bit streams.

16. The method of claim 11 wherein said data symbols are from rational codes; and wherein the bit streams are derived from said data symbols by employing linear algebra.

17. A radically abbreviated decoder comprising:
a) a shift register with a plurality of delay stages;
b) a first exclusive OR gate having a first input coupled to receive an output of a first delay stage of the shift register and a second input coupled to receive an output of a second delay stage of the shift register and based thereon for generating an output;
c) a second exclusive OR gate for receiving symbols from an encoder and the output of the first exclusive OR gate, and based thereon for generating the outputs of the decoder; and
d) a multiplexer for selecting a non-punctured arm from a first arm and a second arm based on a puncture select signal and generating decoded data.

* * * * *